US007009654B2

(12) United States Patent

Kuno et al.

(10) Patent No.: US 7,009,654 B2

(45) Date of Patent: Mar. 7, 2006

(54) IMAGE PICKUP APPARATUS

(75) Inventors: Tetsuya Kuno, Tokyo (JP); Hiroaki Sugiura, Tokyo (JP); Hiroyuki Miyake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 749 days.

(21) Appl. No.: 09/882,025

(22) Filed: Jun. 18, 2001

(65) Prior Publication Data

US 2002/0145676 A1 Oct. 10, 2002

(30) Foreign Application Priority Data

Feb. 26, 2001 (JP) ............................. 2001-050021

(51) Int. Cl.
*H04N 5/225* (2006.01)

(52) U.S. Cl. ....................................... 348/374; 348/335

(58) Field of Classification Search ................ 348/335, 348/373, 374, 207.99, 340, 375
See application file for complete search history.

(56) References Cited

U.S. PATENT DOCUMENTS

| | | | | |
|---|---|---|---|---|
| 5,783,815 | A | 7/1998 | Ikeda | |
| 5,867,368 | A * | 2/1999 | Glenn | 361/783 |
| 6,122,009 | A * | 9/2000 | Ueda | 348/335 |
| 6,172,351 | B1 * | 1/2001 | Kimura | 250/208.1 |
| 2001/0050717 | A1 * | 12/2001 | Yamada et al. | 348/340 |
| 2001/0055073 | A1 * | 12/2001 | Shinomiya | 348/374 |
| 2002/0044215 | A1 * | 4/2002 | Takagi et al. | 348/374 |

FOREIGN PATENT DOCUMENTS

| | | | |
|---|---|---|---|
| FR | 2822326 | A1 | 9/2002 |
| JP | 2-106847 | U | 8/1990 |
| JP | 9-055487 | A | 2/1997 |
| JP | 09055487 | A * | 2/1997 |
| JP | A9121040 | | 5/1997 |
| JP | A9232548 | | 9/1997 |
| JP | 09284617 | A * | 10/1997 |
| JP | A9284617 | | 10/1997 |
| JP | 2001-292365 | A | 10/2001 |
| JP | 2001-333332 | A | 11/2001 |
| JP | 2002-134725 | A | 5/2002 |
| WO | WO 93/22787 | A1 | 11/1993 |
| WO | WO 02/075815 | | 9/2002 |

* cited by examiner

*Primary Examiner*—Thai Tran
*Assistant Examiner*—Timothy J. Henn
(74) *Attorney, Agent, or Firm*—Birch, Stewart, Kolasch & Birch, LLP

(57) ABSTRACT

An image pickup apparatus captures an image from a subject without a focus-adjusting mechanism. An image pickup element has opposed first and second surfaces and an image region formed in the first surface. An optical system causes the image light from the subject to form an image on the image region. A supporting member has a first abutment portion that engages the optical system with nothing sandwiched therebetween, and a second abutment portion that engages the image pickup element with nothing sandwiched therebetween, thereby accurately positioning the optical system relative to the image pickup element. The second abutment portion abuts an area on the first surface except for the image region. A circuit board is fixed to the supporting member and electrically connected to the image pickup element. The circuit board has an opening formed therein such that the image region is exposed through the opening.

5 Claims, 9 Drawing Sheets

IMAGE PICKUP APPARATUS

BACKGROUND OF THE INVENTION

1. Field of the Invention

The present invention relates to an image pickup apparatus that does not require a focus-adjusting mechanism for an optical system.

2. Description of the Related Art

FIG. 7 illustrates a conventional compact image pickup apparatus.

A barrel 21 has an outer threaded cylindrical surface 21*a* and a lens holder 23 has an inner threaded cylindrical surface 23*a*. The barrel 21 is threaded into the lens holder 23 such that the outer threaded cylindrical surface 21*a* fittingly engages the inner threaded cylindrical surface 23*a*. The barrel 21 holds a lens 20 mounted therein and has a rear aperture 22 disposed behind the lens 20. The lens holder 23 holds a substrate 26 at a bottom thereof. An image pickup element 25 is mounted on the substrate 26 and has an image region 25*a* fabricate on a surface thereof. The image region 25*a* is electrically connected via bonding wires 25*b* to leads 25*c* mounted on the substrate 26.

With the aforementioned image pickup apparatus, variations of focussing performance may be encountered during assembly operations. An error in the distance between the lens 20 and the image pickup element 25 determines how precisely the image can be focused on the image pickup element 25. Factors that cause errors in the distance between the lens 20 and the image pickup element 25 include: (1) assembly errors between the lens 20 and the barrel 21, (2) errors in back focus (referred to Bf) due to dimensional errors of the lens 20, (3) dimensional errors of the barrel 21, thickness errors of the infrared filter 24, (4) dimensional errors of the lens holder 23, (5) positional errors of the image region 25*a* in a direction shown by arrow Z, and (6) positional errors between the image pickup element 25 and substrate 26.

The barrel 21 is fitted into the lens holder 23 by screwing the threaded surface 21*a* into the threaded surface 23*a*. Rotating the barrel 21 relative to the lens holder 23 allows the barrel 21 to move relative to the lens holder 23 in the direction shown by arrow Z. The rotation of the barrel 21 allows adjustment of the distance between the lens 20 and the image region 25*a*, thereby accommodating all errors encountered during manufacture to precisely focus an image on the image region 25*a*. This conventional image pickup apparatus requires many components. Moreover, the image pickup apparatus suffers from the problem that individual adjustment of focusing is required after the barrel 21 has been assembled to the lens holder 23. Thus, the apparatus does not lend itself to mass production.

FIG. 8 illustrates an example of another conventional image pickup apparatus disclosed in Laid-open Japanese Patent (KOKAI) No. 9-232548.

The construction of this image pickup apparatus provides improved mounting accuracy of the respective structural elements, thereby eliminating the need for adjustment of focusing.

Referring to FIG. 8, a support member 32 is configured and dimensioned to define mounting positions at which the respective structural elements are accurately positioned relative to one another. A position 32*b* is formed to accurately mount a lens 33 and a mounting portion 32*c* is formed to accurately position an image pickup element 35. The support member 32 is formed with a recess in its bottom in which an adhesive 37 is introduced, thereby preventing the image pickup element 35 from being raised by the adhesive 37. The support member 32 having mounting positions precisely defined therein not only eliminates a mechanism for adjusting focus but also serves to play a role of the barrel 21 and lens holder 23 of FIG. 7, thereby reducing the number of structural components.

A stop 30 has an entrance pupil 30*a* formed therein. The stop 30 is accurately positioned with the aid of a mounting position 32*a*. Reference 35*a* denotes an image region and reference 35*b* denotes a bonding wire.

A lead 36 and the support member 32 are preferably formed in one-piece construction. The support member 36 is usually formed of, for example, acrylic, polycarbonate, ABS (acrylonitrile-butadiene-styrene copolymer), PBT (polybutylene terephthalate), or a synthetic resin. Members such as the support member 32 and lead 36 that have extremely different physical properties are difficult to form in one-piece construction. Therefore, the support member 32 is often divided into a two-piece assembly; an upper portion higher above the lead 36 and a lower portion below the leand 36.

FIG. 9 illustrates factors that cause assembly errors, which in turn affect the focusing performance of an image pickup apparatus of the aforementioned construction.

The factors will be described with respect to a case where the support member 32 is a two-piece structure having an upper portion higher above the lead 36 and a lower portion below the lead 36. An error $\Delta A$ of the back focus is an error that results from an error of a radius of curvature of the lens 33. When the compact size of an image pickup apparatus is of prime importance, the image pickup element 35 is not usually placed in, for example, a ceramic container and is used in chip form. Thus, the thickness of the wafer of the image pickup element 35 has an error $\Delta C$. The support member 32 has a dimensional error $\Delta D$. Thereis an error $\Delta E$ between the image pickup element 35 and the mounting portion 32*c*. The layer of adhesive between the lens 33 and the support member 32 has a thickness error $\Delta F$. If excessive adhesive 37 is not introduced into the recess, the image pickup element 35 is not raised so that the error $\Delta E$ becomes zero. When the upper portion of the support member 32 is connected to the lower portion by means of the adhesive, the adhesive will have a thickness error $\Delta G$. The errors $\Delta A$ to $\Delta D$ and $\Delta F$ and $\Delta G$ affect a maximum focus error of the image pickup apparatus. For the image pickup apparatus of the aforementioned construction not to need adjustment of focusing, the sum $\Delta T=\Delta A+\Delta C+\Delta D+\Delta F+\Delta G$ should be smaller than an acceptable depth of focus $\Delta\delta$. Thus, the errors $\Delta A$, $\Delta C$, $\Delta D$, $\Delta F$, and $\Delta G$ need to be closely controlled, requiring highly dimensional accuracy and assembly accuracy.

The conventional image pickup apparatus of the aforementioned configurations require individual focus adjustment during manufacture of image pickup apparatus, being inefficient in mass production.

The need for focus adjustment requires more number of structural components. In order to provide a focus-adjustment free apparatus, the structural elements should have high levels of dimensional accuracy and assembly accuracy.

FIG. 10 illustrates still another conventional apparatus disclosed in Laid-open Japanese Patent (KOKAI) No. 9-121040. This apparatus is free from focus adjustment. A lens 40 brings light rays from a subject into focus on an image pickup element 44 supported on a substrate 46. The lens 40 and a lens-mounting member 41 are formed in one-piece construction. The lens-mounting member 41 includes legs 42 and beveled positioning surfaces 43. The legs 42 are bonded to the substrate 46 by a UV-curing resin. The beveled positioning surfaces 43 are employed to position the lens 40 relative to the image region of the image pickup element 44 such that the optical axis of the lens 40 passes through the center of the image region. However, the beveled surface is apt to fail to align the optical axis of the lens 40 accurately normal to the surface of the image region, i.e., the optical axis may be at an angle with the line normal to the surface by an angle θ as shown in FIG. 11. In order to solve this problem, a fine adjustment mechanism or a special jig is required when the lens-mounting member 41 is fixedly mounted.

With the conventional image pickup apparatus of FIGS. 10 and 11, the lens 40 and the mechanical supporting structure that support the lens 40 are formed in one-piece construction. This one-piece construction eliminates mounting errors between the lens 40 of the optical system and the lens-mounting member 41 and legs 42. In order to form the lens 40, legs 42, and beveled positioning surfaces 43 in one-piece construction, these structural elements must be molded. The lens 40 that focuses an image on the surface of the image region should be made of a transparent material and the other parts should be made of a material that can block light other than image light. Without blocking unwanted light, optical noise will enter the image formed on the image region of the image pickup element 44. Thus, portions other than the lens 40 should be painted black at a later stage of manufacture.

Alternatively, two types of material may be used: a transparent material such as acrylic PMMA for the lens 40 and a black material for other parts. However, forming an optical system by a two-color molding suffers from a serious technical difficulty because the radius of curvature of the lens 40 requires to be very accurately controlled. Thus, molding the optical system from materials of different colors does not lend itself to mass production.

Further, the construction where the lens and lens-mounting member are formed in one-piece construction does not lend itself to mass production.

The construction where the optical holder abuts a part of the image pickup element suffers from the problem that there are limitations on the position at which the substrate is mounted.

The aforementioned conventional apparatus suffer from the inherent problem that the circuit board is disposed under the image pickup element and therefore the thickness of the circuit board adds to the overall size of the image pickup apparatus.

SUMMARY OF THE INVENTION

The present invention was made in view of the aforementioned problems.

An object of the invention is to provide an image pickup apparatus that requires only a smaller number of structural components and no adjustment operation of focus, provides smaller assembly errors, and lends itself to mass production.

An image pickup apparatus includes an image pickup element, an optical system or lens, and a supporting member. The image pickup element has a first surface and a second surface opposite to the first surface. The image pickup element has an image region formed in the first surface. The optical system causes image light from a subject to form an image on the image region. The supporting member engages the image pickup element and the optical system. The supporting member has a first abutment portion that directly abuts the optical system and a second abutment portion that directly abuts the image pickup element, thereby accurately defining the relative position between the optical system and the image pickup element.

The image pickup apparatus further includes a first holding member that engages the optical system and the supporting member such that the optical system is sandwiched between the first holding member and the supporting member.

The image pickup apparatus further includes a circuit board. The circuit board is fixed to the supporting member and electrically connected to the image pickup element. The circuit board having an opening formed therein such that the image region is exposed through the opening.

The second abutment portion abuts an area on the first surface except for the image region.

The second abutment portion is a projection that extends through the opening to abut an area on the first surface except for the image region.

The image pickup apparatus further includes a second holding member that engages the second surface of the image pickup element and the supporting member such that the image pickup element is sandwiched between the second holding member and the supporting member.

The supporting member, circuit board, and image pickup element are bonded together by an adhesive that is applied to the supporting member, circuit board, and image pickup element except the second abutment portion and the area on the first surface that abuts the second abutment portion.

The adhesive is a UV-curing type adhesive.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein.

DETAILED DESCRIPTION OF THE INVENTION

Embodiments of the invention will be described in detail with reference to the accompanying drawings.

Embodiment

{Construction}

Figure 1:
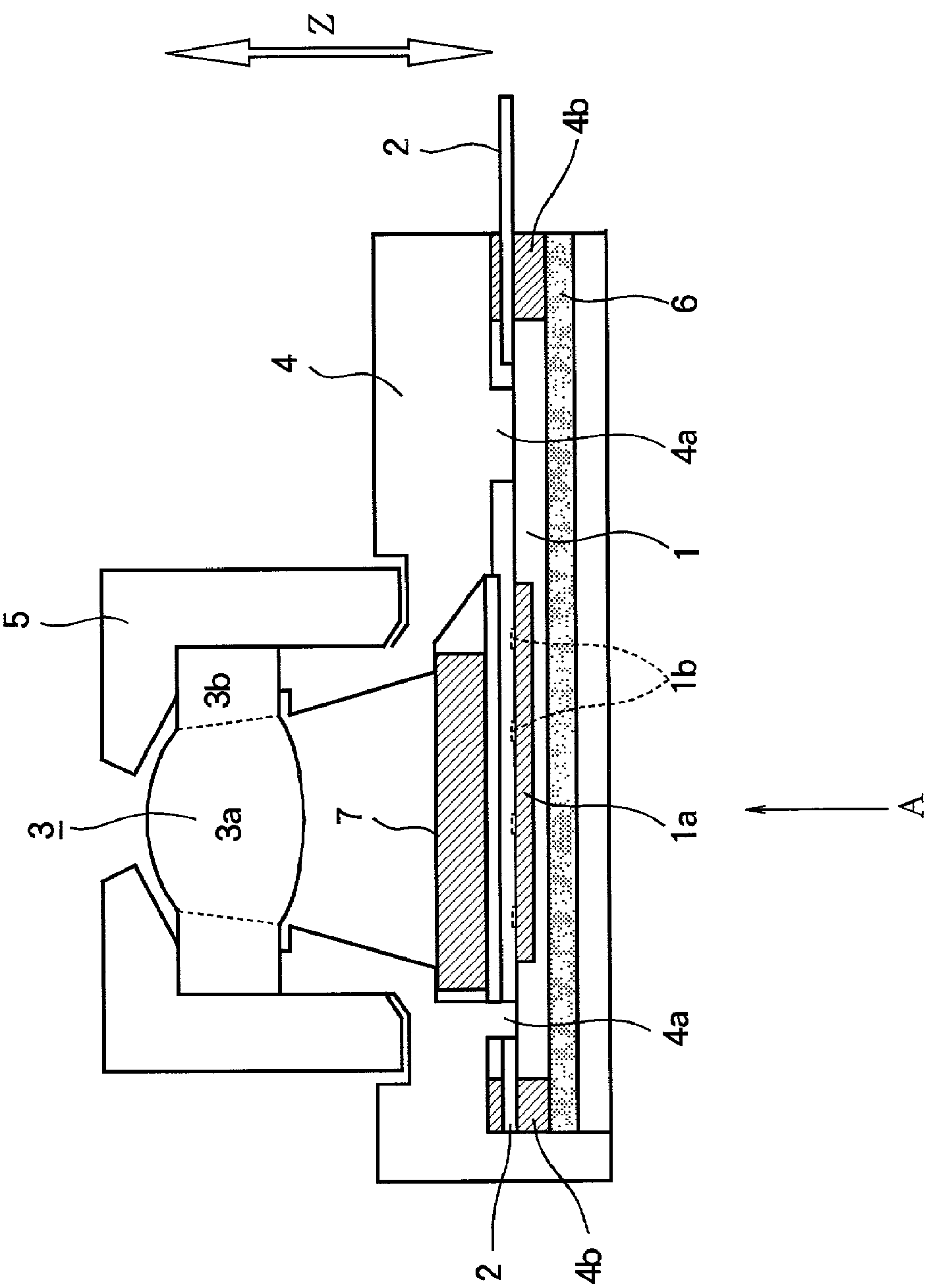
FIG. 1 illustrates a configuration of an image pickup apparatus according to the present invention.

FIG. 1 illustrates a configuration of an image pickup apparatus according to the present invention.

Figure 2A:
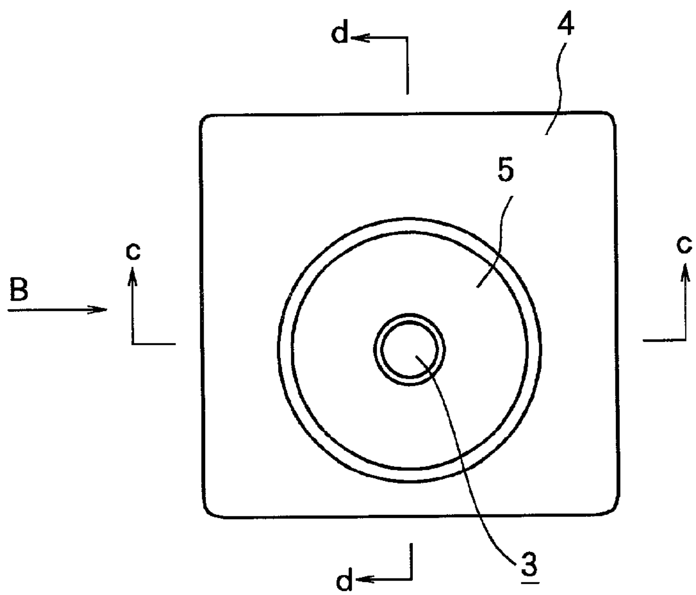
FIGS. 2A and 2B illustrate an outside shape of an optical system, holder, and barrel of the image pickup apparatus of FIG. 1.
Figure 2B:
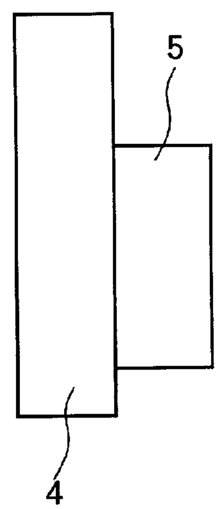

FIGS. 2A and 2B illustrate an outside shape of an optical system, holder, and barrel of the image pickup of FIG. 1.

Figure 2C:
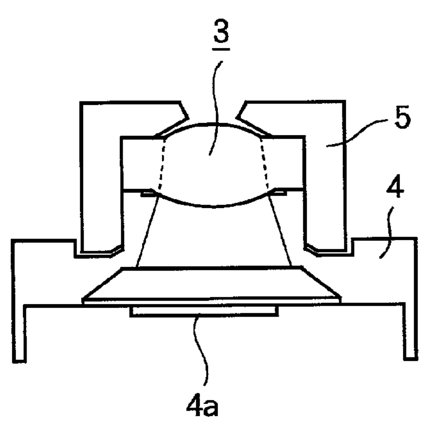
FIGS. 2C and 2D illustrate an inside shape of the optical system, holder, and barrel.
Figure 2D:
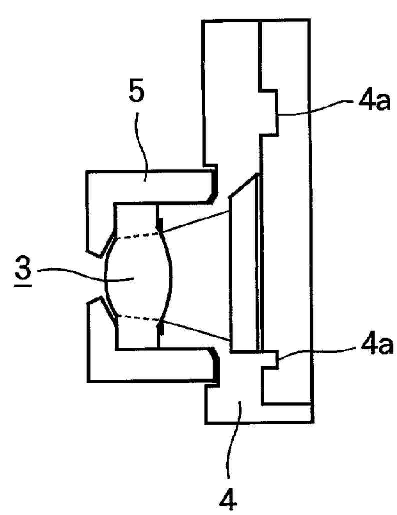

FIGS. 2C and 2D illustrate an inside shape of the optical system, holder, and barrel.

Referring to FIG. 1, the image pickup element 1 takes the form of a bare chip (i.e., just diced from a semiconductor wafer and not packaged). The image pickup element 1 has an image region 1 and electrodes 1*b*. The image region 1*a* converts an image of a subject, focused thereon by the optical system 3, into an electrical signal. The electrical signal is directed from the image region 1*a* to external circuits through the electrodes 1*b*.

Figure 3A:
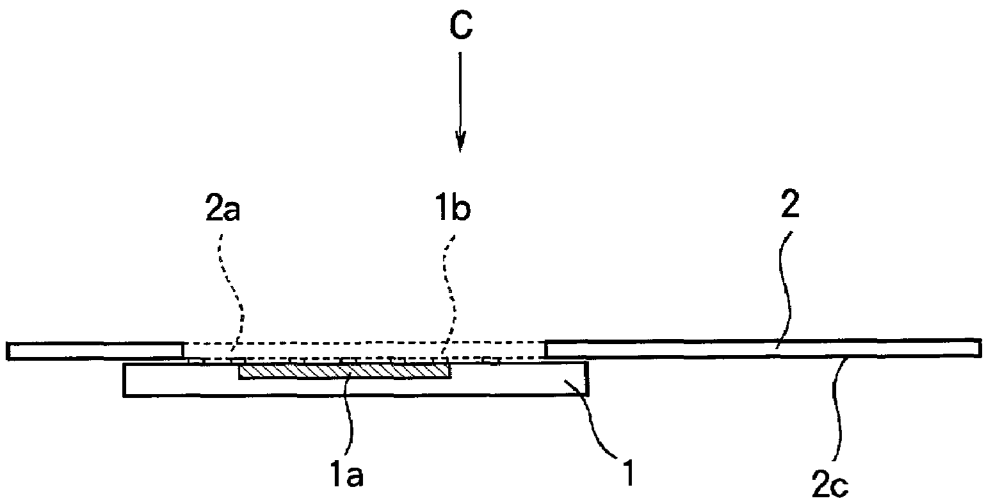
FIG. 3A is an enlarged side view of the image pickup element bonded to a circuit board.

FIG. 3A is an enlarged side view of the image pickup element bonded to a substrate 2.

Figure 3B:
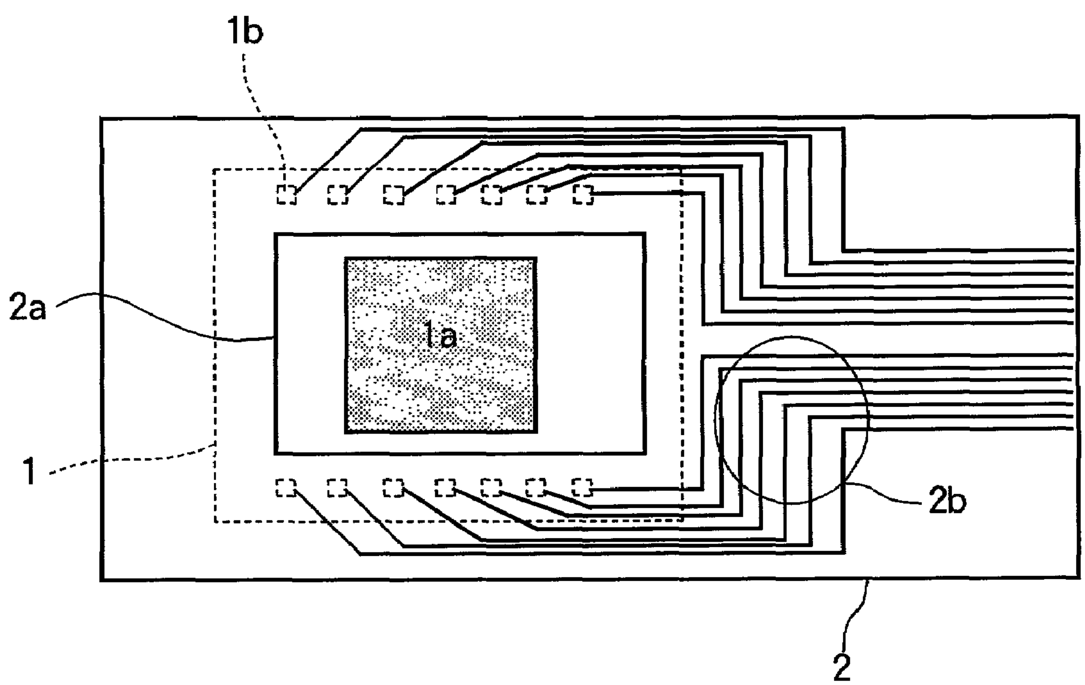
FIG. 3B is a top view of the image pickup element, showing the image pickup element when the image pickup element is viewed in a direction shown by arrow C.

FIG. 3B is a top view of the image pickup element 1 bonded to the substrate 2 when the image pickup element 1 is viewed in a direction shown by arrow C.

In order to implement an image pickup apparatus of small and thin construction, the substrate 2 takes the form of an FPC (Flexible Printed Circuit Board). For example, polyimide substrate offers a substrate having a thickness in the range of 50 to 80 $\mu$m. In the present invention, the substrate can be made of any type of material.

The substrate 2 has an opening 2*a* formed therein such that the image region 1*a* of the image pickup element 1 attached to the substrate 2 is exposed through the opening 2*a*. The circuit patterns 2*b* formed on the substrate 2 are electrically connected through copper bumps to the electrodes 1*b* that serve as output terminals of the circuits formed in the image pickup element 1, thereby making electrical connection between the image pickup element 1 and the substrate 2. The image region 1*a* receives a light image through the opening 2*a* formed in the substrate 2.

The optical system 3 includes a lens 3*a* that forms an image on the image region 1*a* of the image pickup element 1 and a flange 3*b* by which the lens 3*a* is fixedly mounted on other structural member. The lens 3*a* and flange 3*b* are formed as a single component in one-piece construction with each other. The holder 4 supports the optical system 3, an infrared filter 7, and the image pickup element 1. The holder 4 serves to block light other than the subject. The holder 4 is formed of a material such as polycarbonate (PC), which is an opaque material. The barrel 5 is also formed of an opaque material and fits over the optical system 3 and the holder 4 to firmly hold the optical system 3. The infrared filter 7 is a compensation filter that adjusts the spectral sensitivity of the image pickup element 1 to the spectral luminous efficiency of human. The infrared filter 7 is usually implemented in the form of a colored glass board or by vapor depositing a color filter on a transparent glass board. The sensor supporting plate 6 holds the image pickup element 1 against the holder 4.

Figure 4:
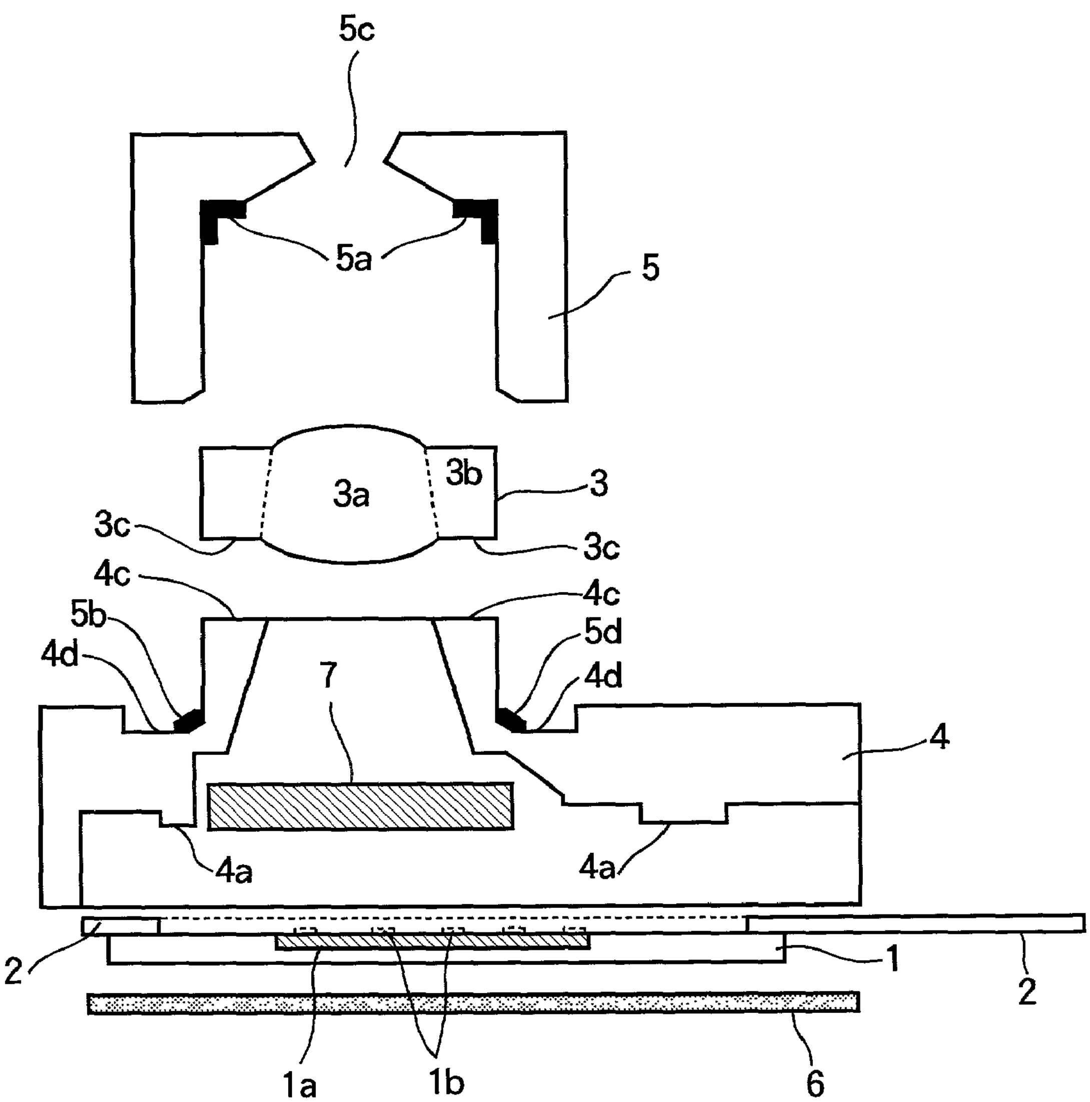
FIG. 4 is an exploded side view of the image pickup apparatus of FIG. 1.

FIG. 4 is an exploded side view of the image pickup apparatus of FIG. 1.

The flange 3*b* of the optical system 3, which does not affect any optical properties of the optical system 3, is in contact with a contact surface 4*c* of the holder 4. The flange back, i.e., the distance between the image region 1*a* and a contact surface 3*c* of the flange 3*b*, is a distance that affects focusing performance of the image pickup apparatus. The contact surface 3*c* of the flange 3*b* may be formed as a flat surface and the flat contact surface 3*c* is pressed against the contact surface 4*c*, facilitating the mounting of the optical system to the holder 4 as well as preventing mounting errors from occurring.

The contact surface 4*c* and the contact surface 3*c* are directly in contact with each other without any mechanical member sandwiched therebetween. In other words, the holder 4 and optical system 3 are merely pressed against each other.

The barrel 5 fits over the optical system 3 arranged on the holder 4 and is bonded at parts 5*a* and 5*b* (FIG. 4) to the holder 4. The barrel 5 is bonded to the optical system 3 by means of an adhesive (indicated a black portion in FIG. 4) applied to the part 5*a*, and to the holder 4 by means of the adhesive applied to the part 5*b*. As a result, the optical system 3 and holder 4 are firmly fixed with their contact surfaces 3*c* and 4*c* in pressure contact with each other. The holder 4 is formed with a groove 4*d* into which excessive adhesive bleeds when the barrel 5 is bonded to the holder 4. The barrel 5 has an opening or aperture 5*c* that serves as a stop through which image light from a subject is directed into the image pickup apparatus.

The adhesive may be applied to the optical system 3 and holder 4 instead of the parts 5*a* and 5*b* of the barrel 5. In that case, care should be taken not to allow the adhesive to bleed between the contact surface 3*c* and the contact surface 4*c*.

The use of the barrel 5 and holder 4 of the aforementioned construction eliminates the need for molding the lens 40 and lens-mounting member 41 in one-piece construction or two-color molding, while still offering an image pickup apparatus free from mounting errors that affect the focusing performance of the image pickup apparatus. Closely controlling the inner dimensions of the barrel 5 and outer dimensions of the optical system 3 and the holder 4 eliminates the need for an operation in which the optical axis of the optical system 3 is precisely adjusted to pass through the center of the image region 1*a*. This also eliminates the problem of the conventional apparatus that the optical axis of the lens may fail to be normal to the image region of the image pickup element.

The infrared filter 7 is bonded to the holder 4 by an adhesive. The position of the infrared filter 7 in the direction shown by arrow Z does not affect the focusing performance, and therefore the description thereof is omitted.

Figure 5:
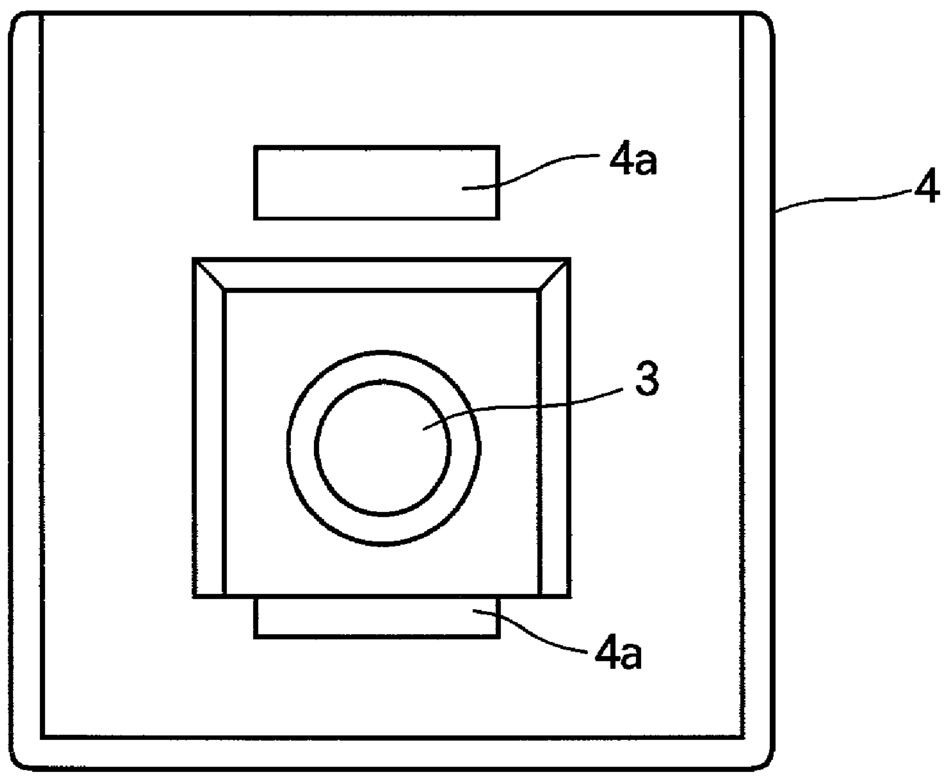
FIG. 5 illustrates the holder when it is seen from a direction in which the image pickup element is mounted to the holder.

FIG. 5 illustrates the holder 4 when it is seen from a direction in which the image pickup element 1 is mounted to the holder 4 (FIG. 4).

The holder 4 has two projections 4*a* that serve as a means for supporting the image pickup element 1. The projections $4a$ extend through the opening $2a$ formed in the substrate 2 into contact with a surface of the image pickup element 1 except the image region $1a$. There is nothing provided between surfaces of the projections $4a$ and the image pickup element 1. Allowing the projections $4a$ to extend through the opening $2a$ is advantageous in that the image pickup element 1 is assembled in direct contact with the holder 4 without the substrate 2 sandwiched between the image pickup element 1 and the substrates 2. This eliminates the substrate 2 from the structural components that affect the focusing performance while allowing the other structural components to be accurately positioned relative to one another. It is to be noted that the substrate 2 is disposed on the image region side of the image pickup element 1. The structure is suitable for miniaturizing an image pickup apparatus because the thickness of the substrate does not add to the overall dimension of the image pickup apparatus in the direction of the optical axis.

The sensor supporting plate 6 engages the bottom surface of the image pickup element 1 and the substrate 2 in order to hold them against the holder 4. The image pickup element 1, holder 4, and sensor supporting plate 6 are bonded together by an adhesive $4b$ (FIG. 1) applied around the sensor supporting plate 6. Bonding the sensor supporting plate 6 to the holder 4 and the image pickup element 1 allows the image pickup element 1 to be fixed with a surface area other than the image region $1a$ pressed against the surfaces of the projections $4a$.

Figure 6A:
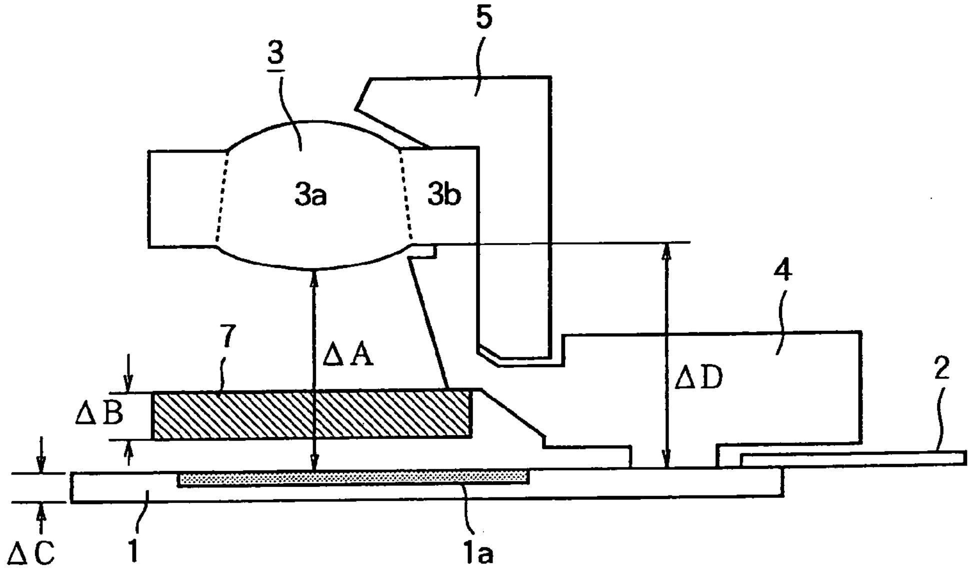
FIG. 6A illustrates various factors that affect the focusing performance of the image pickup apparatus.

FIG. 6 illustrates various factors that affect the focusing performance of the image pickup apparatus.

$\Delta A$ denotes an error of Bf due to dimensional errors of the optical system 3 resulting from molding process. Conventional mounting errors in the Z direction (FIG. 1) due to variations of the thickness of an adhesive do not occur because the optical system 3 abuts the holder 4 directly and the image pickup element 1 abuts the holder 4 directly.

The infrared filter 7 does not affect the focusing performance wherever the infrared filter 7 is disposed between the lens $3a$ and the image region $1a$ of the image pickup element 1. Only variations in the thickness of the infrared filter 7 affects the focusing performance. $\Delta B$ denotes an error of thickness of the infrared filter 7 expressed in terms of distance in air taking the refraction index of the infrared filter 7 into account.

$\Delta C$ denotes an error of thickness of the image pickup element 1 (distance from the bottom of the image pickup element to the image region $1a$). $\Delta D$ denotes an error of dimension of the holder 4 in the Z direction from the contact surface $4c$ to the surface of the projection $4a$ in contact with the image pickup element 1. Because the upper surface of the image pickup element 1 directly abuts the holder 4, the back focus Bf is determined by the distance between the lens $3a$ and the image region $1a$. It is to be noted that the errors $\Delta C$ and the thickness of the substrate 2 are not factors that affect the focusing performance. Therefore, the resulting error that affects the focusing performance is $\Delta A+\Delta B+\Delta D$. If the value of $\Delta A+\Delta B+\Delta D$ is smaller than a focal depth $\Delta\delta$ of the optical system 3, then there is no need for adjustment of focusing.

The following is the description of the aforementioned individual factors. The field angle of the optical system 3 is usually in the range of 50 to 55 degrees, and the optical size of the image region $1a$ of the image pickup element 1 is in the range of ⅛ to ⅐ inches. Thus, the thickness of the lens is on the order of several millimeters. From the dimensional error of the optical system 3, $\Delta A$ is expected to be ±10 to 20 $\mu$m. The Bf of the optical system 3 is in the range of 2 to 4 mm. The dimension of the holder 4 in the Z direction from the optical system 3 to the top surface of the image pickup element 1 is substantially equal to the Bf. Likewise, the dimensional error of the holder 4 is expected to be in the range of ±10 to 20 $\mu$m. When the holder 4 is molded, the aforementioned error includes variations of linear expansion coefficient of the molded material. The thickness of the infrared filter 7 is assumed to be 0.55 mm and the variation of thickness is expected to be in the range of ±20 $\mu$m. The infrared filter 7 is often in the form of a glass plate having a refraction index $n\approx1.5$. Therefore, the error $\Delta B$ is about ±6.7 $\mu$m.

The following is an exemplary numerical value of the maximum error.

$$\Delta A+\Delta B+\Delta D=\pm20\pm6.7\pm20=\pm46.7\ \mu\text{m}$$

The approximate focal depth of the image pickup apparatus according to the present invention can be calculated on the basis of the F-number (i.e., the brightness of the optical system) and the least circle of confusion of the optical system. The least circle of confusion of the image pickup element 1 can be substituted by the size of a pixel. Assuming that the F-number is equal to 2.8 and the size of the pixel is 20 $\mu$m, the focal depth $\Delta\delta$ is given by $\Delta\delta=\pm2.8\times20\ \mu\text{m}=\pm56\ \mu\text{m}$. The calculated focal depth ±56 $\mu$m is greater than the resulting maximum dimensional error ±46.7 $\mu$m such that sufficiently focused images can be formed on the image region $1a$. The above described values are only exemplary and the values of F-number, pixel size, and field angle, and the size of image pickup element are not limited to those described above.

Figure 6B:
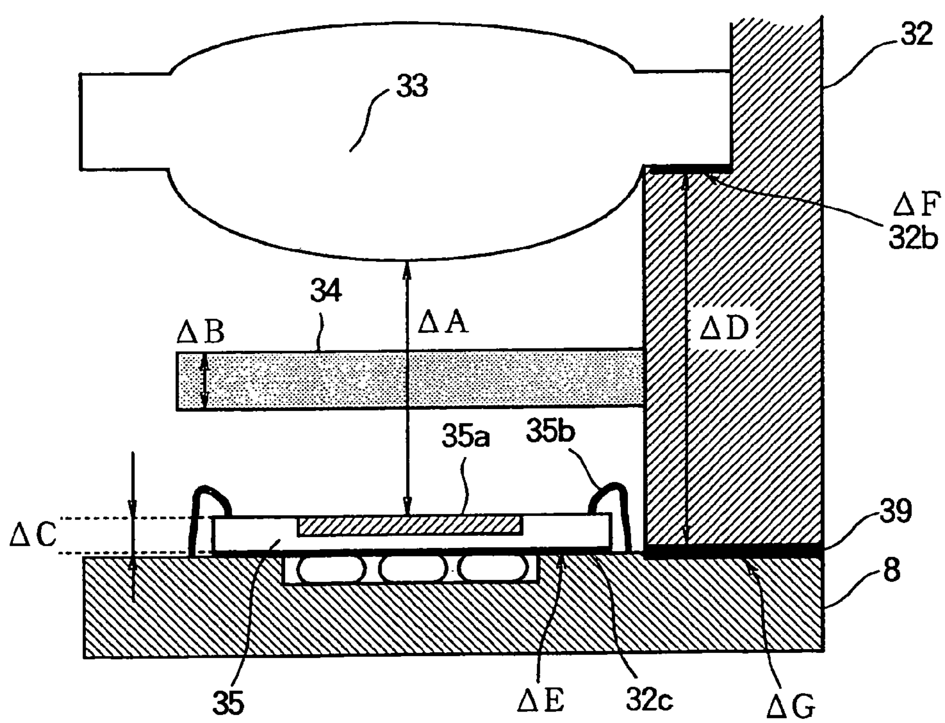
FIG. 6B illustrates various factors that affect the focusing performance of a conventional apparatus of FIG. 8.
Figure 7:
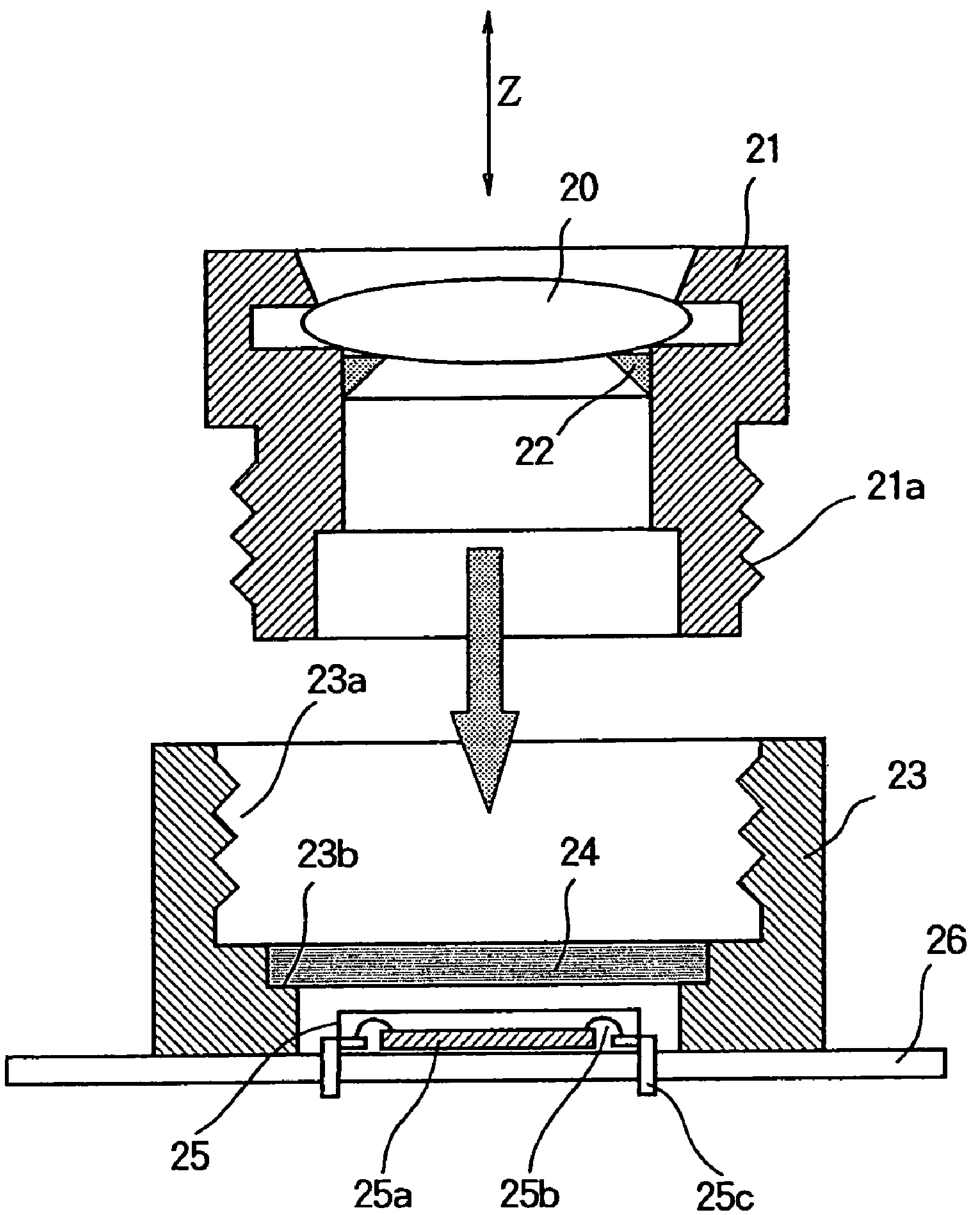
FIG. 7 illustrates a conventional compact image pickup apparatus.
Figure 8:
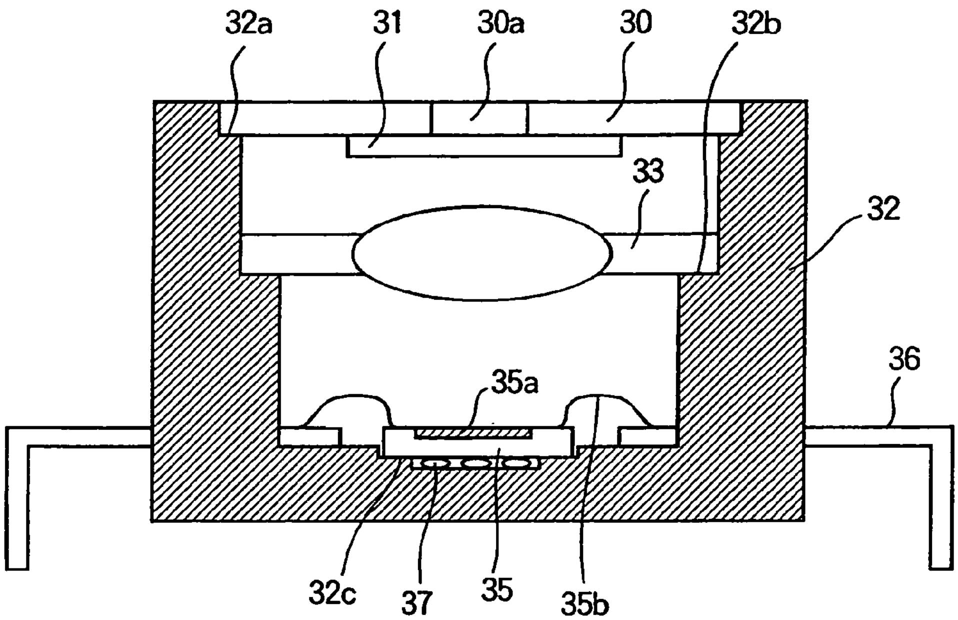
FIG. 8 illustrates an example of another conventional image pickup apparatus disclosed in Laid-open Japanese Patent (KOKAI) No. 9-232548.
Figure 9:
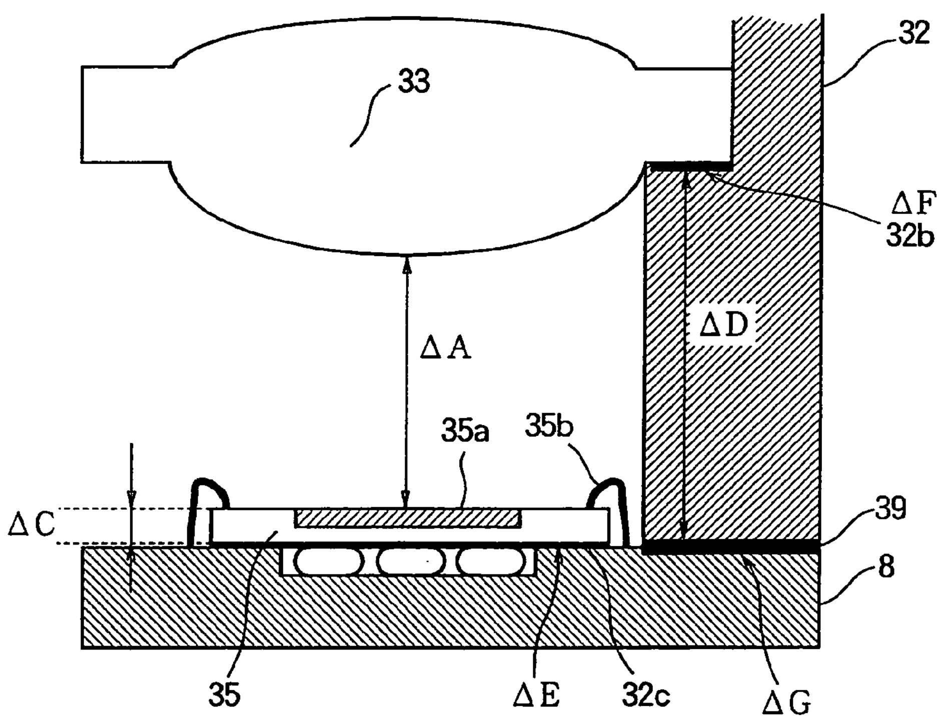
FIG. 9 illustrates factors that cause assembly errors that affect the focusing performance of the image pickup apparatus of the aforementioned construction.
Figure 10:
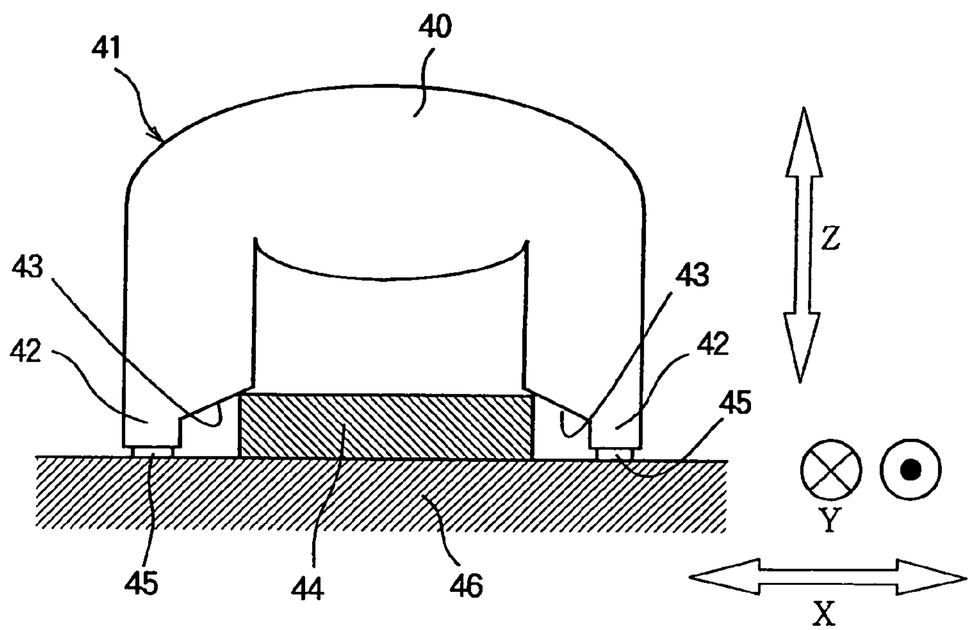
FIG. 10 illustrates still another conventional apparatus disclosed in Laid-open Japanese Patent (KOKAI) No. 9-121041.
Figure 11:
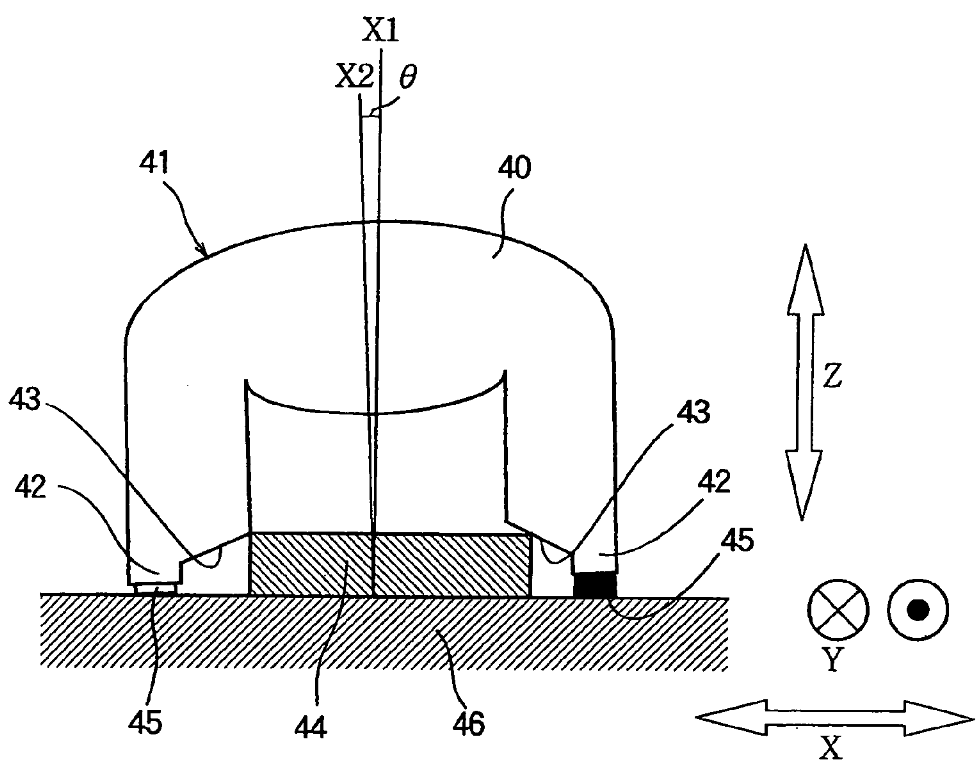
FIG. 11 illustrates mounting errors when the conventional apparatus of FIG. 10 is assembled.

FIG. 6B illustrates factors that affect focusing performance of the conventional image pickup apparatus when an infrared filter 34 similar to that infrared filter 7 of the invention is mounted to the apparatus.

The conventional image pickup apparatus suffers from larger resulting maximum errors if an error $\Delta G$ of the thickness of the adhesive applied between the support 32 and the substrate 8 is taken into consideration. It is often difficult to form the support 32 and the leads in one-piece construction, in which case, the supporting portion is divided into two parts: the support 32 and the substrate 8. For example, let us assume that the error $\Delta A$ of the Bf of the lens 33 is in the range of ±10 to 20 $\mu$m and the dimensional error $\Delta D$ of the support 32 is in the range of ±10 to 20 $\mu$m. If the amount of adhesive in the recess is not much such that the mounting portion $32c$ of the image pickup element 1 will not be raised by the adhesive, then the error $\Delta E$ can be zero. Because the image pickup element is positioned relative to the holder 4 by causing the substrate to abut the holder 4, the error of thickness $\Delta C=\pm30\ \mu\text{m}$ results when the image pickup element 1 has a thickness of 400 $\mu$m. The error of thickness of the adhesive between the lens 33 and the support 32 is less than several microns. Assuming that $\Delta F$ is 4 $\mu$m, the resulting maximum error is given by the following calculation.

$$\begin{aligned}\Delta A+\Delta B+\Delta C+\Delta D+\Delta F &= \pm20\pm6.7\pm30\pm20\pm4\ \mu\text{m}\\ &= \pm80.7\ \mu\text{m}\end{aligned}$$

The image pickup apparatus according to the invention does not suffer from the error $\Delta F$ that results from an adhesive between the lens 33 and the support 32. In addition, the image pickup element 1 is assembled with the image region surface of the image pickup element abutting the holder 4. Mounting the image pickup element in this manner eliminates the error ΔC from factors that cause a focusing error. The configuration of the image pickup apparatus according to the invention greatly reduces factors of focusing error, eliminating the need for a focus adjusting means. Moreover, the image pickup apparatus of the invention need not be assembled as accurately as the conventional apparatus.

The image pickup element 1, holder 4, and sensor supporting plate 6 may be bonded together by using a UV-curing adhesive that cures when the adhesive is exposed to UV light. Because the UV curing adhesive cures quickly at low temperature, the respective structural members are not subject to positional errors during the assembly process. The UV curing adhesive shrinks little and therefore shrinkage of the adhesive during its curing process does not cause significant positional errors of the structural members. Further, less heat shrinkage and high heat resistance of the UV curing adhesive offers an image pickup apparatus that is unaffected by heat. The UV curing adhesive is applied to a portion 4*b* of FIG. 1.

The lens 3*a* of the optical system 3 of the present invention is a double convex lens but the lens 3*a* can be a combination of a convex lens and a concave lens.

The barrel 5 is bonded to the optical system 3 and holder 4 to fix the optical system 3 to the holder 4. Instead of using an adhesive, the barrel 5, holder 4, and optical system 3 may be dimensioned with high accuracy such that the barrel 5 is simply fitted over the optical system 3 and holder 4 to securely hold the optical system 3 against the holder 4.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An image pickup apparatus comprising:

an image pickup element having a first surface and a second surface opposite to the first surface, said image pickup element having an image region formed in the first surface;

an optical system that causes image light from a subject to form an image on the image region;

a supporting member that engages said image pickup element and said optical system, said supporting member having a first abutment portion that directly abuts said optical system and a second abutment portion that directly abuts said image pickup element;

a first holding member that engages said optical system and said supporting member such that said optical system is sandwiched between the first holding member and said supporting member; and a circuit board being fixed to said supporting member and electrically connected to said image pickup element, said circuit board having an opening formed therein such that said image region is exposed through the opening.

2. The image pickup apparatus according to claim 1, wherein the second abutment portion is a projection that extends through the opening.

3. The image pickup apparatus according to claim 1, further comprising a second holding member that engages the second surface and said supporting member such that said image pickup element is sandwiched between the second holding member and said supporting member.

4. The image pickup apparatus according to claim 1, wherein said supporting member, circuit board, and image pickup element are bonded together by an adhesive that is applied to said supporting member, circuit board, and image pickup element except for the second abutment portion and the area on the first surface that abuts the second abutment portion.

5. The image pickup apparatus according to claim 4, wherein the adhesive is a UV-curing type adhesive.

* * * * *